United States Patent
Hayashizaki

(10) Patent No.: US 6,642,621 B2
(45) Date of Patent: Nov. 4, 2003

(54) CAPACITOR-TYPE SEMICONDUCTOR DEVICE

(75) Inventor: Hiroshi Hayashizaki, Ukyo-ku (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/967,720

(22) Filed: Sep. 28, 2001

(65) Prior Publication Data

US 2002/0047204 A1 Apr. 25, 2002

Related U.S. Application Data

(60) Continuation-in-part of application No. 09/451,221, filed on Nov. 29, 1999, now abandoned, which is a continuation-in-part of application No. 09/294,688, filed on Apr. 19, 1999, now abandoned, which is a division of application No. 09/217,109, filed on Dec. 21, 1998, now abandoned.

(30) Foreign Application Priority Data

Dec. 24, 1997 (JP) .............................. 9-354626

(51) Int. Cl.$^7$ ............................. H01L 23/48
(52) U.S. Cl. ................ 257/755; 257/314; 257/412
(58) Field of Search ................ 257/755, 756, 257/314, 315, 412–415

(56) References Cited

U.S. PATENT DOCUMENTS

| 4,935,380 A | * | 6/1990 | Okumura | |
| 5,071,788 A | | 12/1991 | Joshi | |
| 5,418,398 A | * | 5/1995 | Sardella et al. | 257/755 |
| 5,656,840 A | | 8/1997 | Yang | |
| 5,801,427 A | * | 9/1998 | Shiratake et al. | 257/412 |

* cited by examiner

Primary Examiner—Carl Whitehead, Jr.
Assistant Examiner—Yennhu B Huynh
(74) Attorney, Agent, or Firm—Merchant & Gould P.C.

(57) ABSTRACT

It is an object of the present invention to provide a semiconductor device capable of decreasing electric resistance of a lower electrode provided therein, as well as capable of accurately responding to external signals having high frequencies inputted therein. The lower electrode 7 consists of three layers such as a silicon lower electrode layer 7a made of poly-crystalline silicon, a tungsten-silicide layer 7b made of tungsten silicide as a chemical compound of tungsten and silicon, and a protection layer 7c made of poly-crystalline silicon. By constructing the semiconductor device as described above, oxidation of the tungsten-silicide layer 7b may be prevented by the protection layer 7c made of poly-crystalline silicon even when oxidation layers of an ONO (silicon oxidation) layer 11 is formed by thermal oxidation. Consequently, electric resistance of the lower electrode 7 can be decreased.

15 Claims, 12 Drawing Sheets

CAPACITOR-TYPE SEMICONDUCTOR DEVICE

CROSS-REFERENCE TO RELATED APPLICATION

This application is a continuation-in-part of application Ser. No. 09/451,221 filed Nov. 29, 1999, now abandoned, which is a continuation-in-part application of Ser. No. 09/294,688 filed Apr. 19, 1999, now abandoned, which is a divisional application of Ser. No. 09/217,109 filed Dec. 21. 1998 now abandoned.

BACKGROUND OF INVENTION

1. Field of the Invention

This invention relates to a semiconductor device and a method of manufacturing thereof, and more specifically, to a semiconductor device comprising an electrode having a low electric resistivity and a method of manufacturing the same.

2. Description of the Related Art

A semiconductor device 100 including a capacitor therein (hereinafter referred to as capacitor type semiconductor device) used conventionally is diagrammed in FIG. 9. The capacitor type semiconductor device comprises a semiconductor substrate 101, a field oxidation layer 103, a lower electrode 105, side walls 107, an ONO (oxide-nitride-oxide) layer 109, an upper electrode 113, an inter-layer film 115, electrodes 117 for contact, and a passivation layer 119. Both the lower electrode 105 and the upper electrode 113 are made of polysilicon.

Next, a method of fabricating the capacitor type semiconductor device 100 will be briefly described hereunder. The lower electrode 105 is formed by carrying out etching to a poly-silicon layer provided on the field oxidation layer 103 after disposing the field oxidation layer 103 on the semiconductor substrate 101. Then, the ONO layer 109 is formed on the field oxidation layer 103 so as to cover both the lower electrode 105 and the side walls 107.

The ONO layer 109 is formed in the order described below. At first, a silicon-oxidation (oxidation) layer which contacts to the lower electrode 105 is formed by thermal oxidation. The temperature caused by thermal oxidation is approximately 900. Then, a silicon nitride (nitride) layer is disposed by low pressure chemical vapor deposition (LPCVD). Thereafter, another silicon oxidation (oxidation) layer positioned at the uppermost of the ONO layer 109 is formed by thermal oxidation similar to the silicon oxidation layer previously formed.

Another layer made of poly-silicon is provided on the ONO layer 109 thus formed. The upper electrode 113 is formed by carrying out etching to the poly-silicon layer provided on the ONO layer 109. The inter-layer film 115 is formed by carrying out reflow process after disposing a layer made of Boro-Phospho-Silicate Glass (BPSG) on the entire surface. Thereafter, the contact electrodes 117 made of aluminum, or other materials having a high conductivity are provided in openings formed for the electrodes. Then the passivation layer 119 is disposed on the entire surface.

In the capacitor type semiconductor device 100 described above, however, the following problems are encountered. Poly-crystalline silicon has been used for electrodes as one of materials having the most stable and excellent electric characteristics. In large scale integrated circuits (LSIs), a high integration and a fine work become a technological trend. A relatively high electric resistance which is originally owned by poly-crystalline silicon is a key issue to be resolved. Electric signals passing through a layer made of poly-crystalline silicon drastically slow down their transmission speed because of the high electric resistance, so that high-speed operation of LSIs can not be achieved.

In order to reduce the electric resistance of the layer made of consisting poly-crystalline silicon, a chemical compound such as silicide made of silicon and metals is used instead of poly-crystalline silicon. Silicide has the following advantages; electric resistivity is approximately one tenth of poly-crystalline silicon, stable in processes carried out at a high temperature, and having a high chemical resistance.

In general, a gate electrode consisting two layers made of poly-crystalline silicon and silicide is formed when silicide is used as a material of an electrode. This is to adjust conditions at the boundary of the silicide layer such as work function and/or surface density of charge to the conditions of the poly-crystalline silicon layer having stable characteristics. At present, silicide mainly used is a refractory metal silicide such as tungsten silicide (WSi2) and the like.

However, it accompanies much difficulties to turn the material of the lower electrode 105 into silicide (silicification) considering the manufacturing process of the capacitor type semiconductor device 100. Because the ONO layer 109 is used as an intermediate layer of a capacitor provided in the capacitor type semiconductor device 100. Therefore, the silicon oxidation layer forming the lowermost position of the ONO layer 109 must be disposed on the lower electrode 105. As described, the silicon oxidation layer is formed by thermal oxidation.

On the contrary, it is assumed that the material of the lower electrode 105 is turned into silicide by using tungsten and the like. In that case, adverse effects are caused on a surface of the lower electrode where is turned into silicide by carrying out thermal oxidation. Since the thermal oxidation is carried out at a very high temperature, tungsten once turned into silicide is unexpectedly oxidized. As a result of the oxidation, one of the advantages of silicide such as the electric resistivity approximately one tenth of poly-crystalline silicon can not be maintained.

It is, therefore, very difficult to reduce electric resistance of the lower electrode 105 by turning the material of the electrode into suicide because of the thermal oxidation carried out for forming the ONO layers.

SUMMARY OF THE INVENTION

It is an object of the present invention to overcome the above mentioned drawbacks of the capacitor type semiconductor device, and to provide a semiconductor device capable of decreasing electric resistance of a lower electrode provided therein.

In accordance with characteristics of the present invention, there is provided a semiconductor device comprising:
 a lower electrode formed on a semiconductor substrate,
 an insulation layer disposed on the lower electrode, and
 an upper electrode formed on the insulation layer,
 wherein the lower electrode includes a protection part formed with an oxygen penetration restricting material and a low electric resistance part formed with an anaerobic material having a lower electric resistant than that of the oxygen penetration restricting material, and wherein the protection part is located between the low electric resistance part and the insulation layer.

In accordance with characteristics of the present invention, there is provided a method of manufacturing a semiconductor device comprising the steps of:

forming a low electric resistance part made of an anaerobic material having a certain conductivity on a semiconductor substrate, disposing a protection part made of an oxygen penetration restricting material on the low electric resistance part, forming an insulation layer on the protection part by thermal oxidation, and disposing an upper electrode on the insulation layer.

While the novel features of the invention are set forth in a general fashion, both as to organization and content, the invention will be better understood and appreciated, along with other objects and features thereof from the following detailed description taken in conjunction with the drawings.

DETAILED DESCRIPTION OF THE PREFERRED EMBODIMENT

Figure 1:
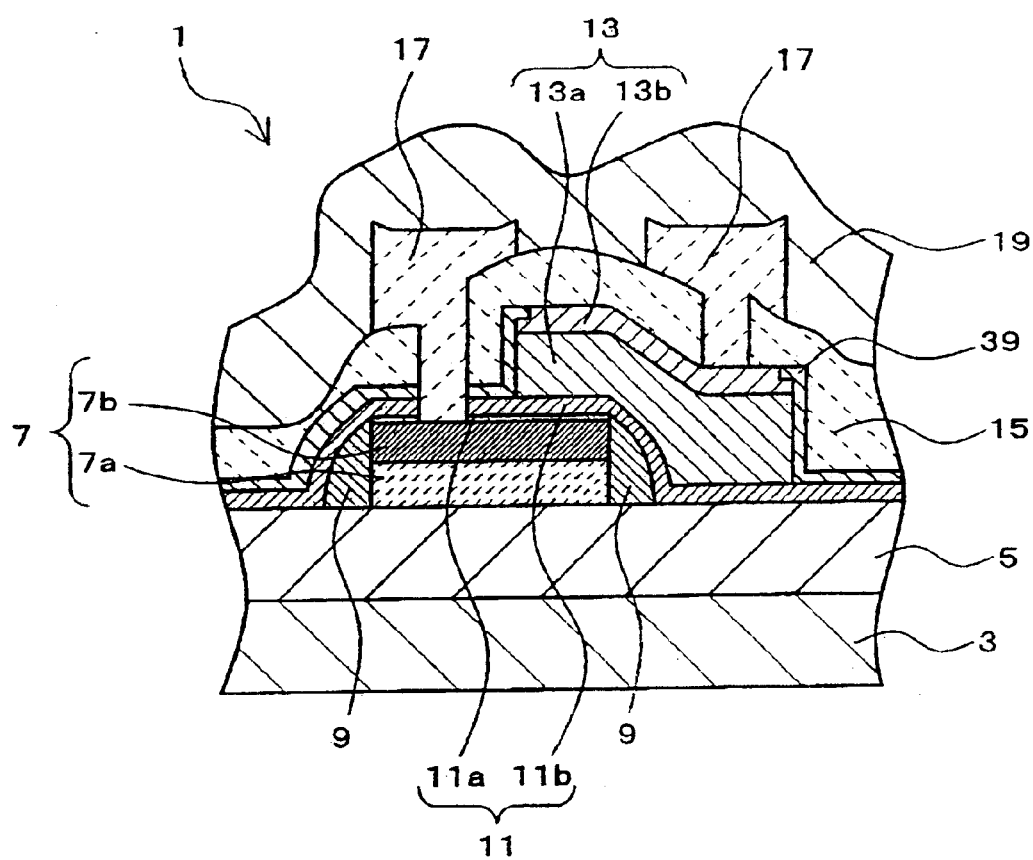
FIG. 1 is a cross-sectional view for describing an embodiment of a semiconductor device according to the present invention, and illustrating the main features of a capacitor type semiconductor device 1.

An embodiment of a semiconductor device according to the present invention will be described hereunder as a capacitor type semiconductor device 1. The most significant difference between the semiconductor device 1 and a capacitor type semiconductor device conventionally used is that the semiconductor device 1 realizes a remarkable reduction of electric resistance of the lower electrode by turning the material of the electrode into silicide (silicification). In this way, the semiconductor device 1 may accurately respond to the signals externally inputted therein, the signals having high frequencies (1) Structure of the Capacitor Type Semiconductor Type Semiconductor Device FIG. 1 is a cross-sectional view illustrating the main features of the semiconductor device 1. The semiconductor device 1 includes a semiconductor substrate 3, a field oxidation layer 5, a lower electrode 7, side walls 9, an insulation layer 11, an upper electrode 13, an interlayer film 15, electrodes 17 for contact, and a passivation layer 19.

The insulation layer 11 comprises an ONO layer 11b containing oxygen and a silicon capacitance layer 11a of poly-crystalline silicon.

The lower electrode 7 includes a tungsten-silicide layer 7b formed by using a chemical compound of tungsten and silicon. The lower electrode 7 consists of two layers such as a silicon lower electrode layer 7a of poly-crystalline silicon and the tungsten-silicide layer 7b.

Further, the upper electrode 13 consists of two layers such as a silicon upper electrode layer 13a made of poly-crystalline silicon and a titanium silicide layer 13b made of titanium silicide as a chemical compound composed of titanium and silicon.

Here, correspondence between elements used in this embodiment and elements used in the claims is defined as the follows. The ONO layer 11b, poly-crystalline silicon, the silicon capacitance layer 11a, a chemical compound of tungsten and silicon, the tungsten-silicide layer 7b and tungsten respectively form a first capacitance portion, an oxygen penetration restricting material, a second capacitance portion, an anaerobic material (a material which changes its property when it is exposed to oxygen having a tendency to oxidize under a high temperature), a low electric resistance part, and a refractory metal.

Figure 9:
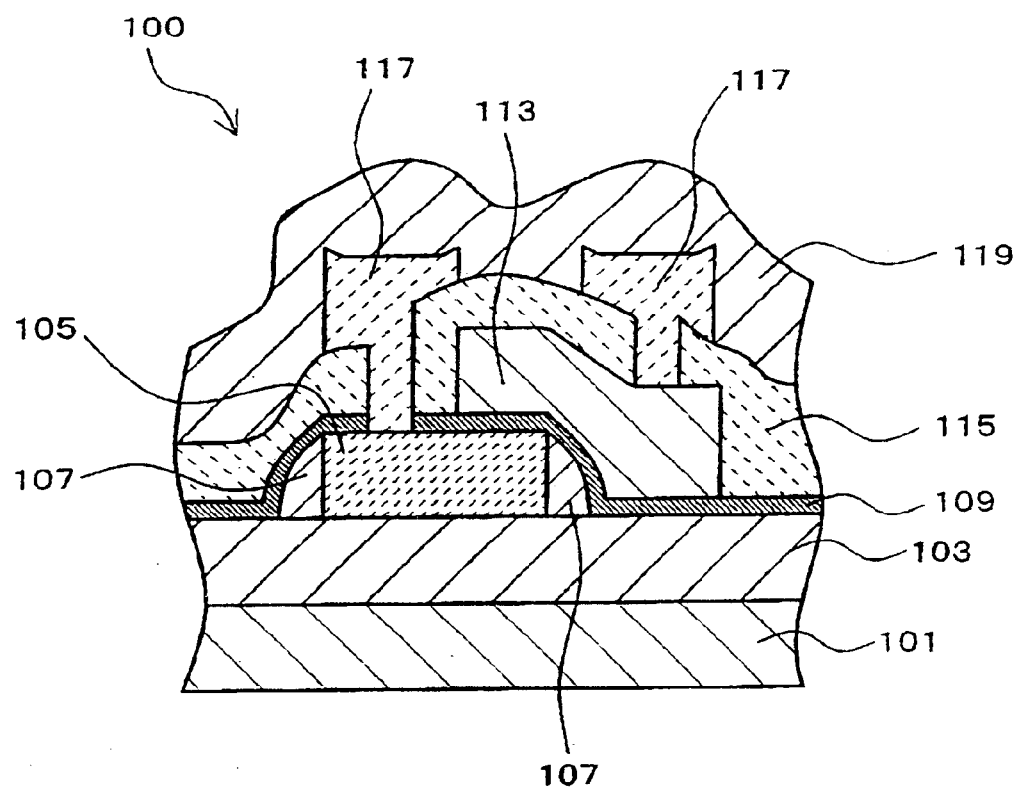
FIG. 9 is a cross-sectional view of a semiconductor device 100 used conventionally.

The following data were taken in experiment conducted prior to this application. The capacitance of the semiconductor device 1 according to the present invention including the silicon capacitance layer 11a becomes 19.17 [pF] when that of the prior art capacitance type semiconductor device (see FIG. 9) forming the ONO layer 11b without providing the silicon capacitance layer 11a was 22.83 [pF]. The reason why the capacitance did not decrease remarkably after forming the silicon capacitance layer 11a is that silicon selected from various materials because of its high dielectricity is used for a protection layer. In accordance with the data, it is estimated that the silicon capacitance layer 11a is formed in approximately 90 angstroms in thickness. In the semiconductor device 1, the tungsten-silicide layer 7b having less resistance than that of poly-crystalline silicon can be formed without any restrictions because the silicon capacitance layer 11a of poly-crystalline silicon prevents oxidation of the chemical compound of tungsten and silicon used for forming the tungsten-silicide layer 7b even when the ONO layer 11b is formed under thermal oxidation technique.

In this way, the electric resistance of the lower electrode 7 can be decreased. In other words, it is possible to provide a semiconductor device capable of responding with accuracy to the signals externally inputted therein, the signals having high frequencies.

(2) Method of Fabricating the Capacitor Type Semiconductor Device

Next, a method of fabricating the semiconductor device 1 will be described with reference to FIG. 2A through FIG. 5D. The field oxidation layer 5 is formed on the semiconductor substrate 3 in thickness of 5,500 angstrom (see FIG. 2A). A poly-crystalline silicon layer 31 is disposed on the field oxidation layer 5 thus formed in thickness of 1,500 angstrom (see FIG. 2B).

Then, highly concentrated phosphorous is implanted into the poly-crystalline silicon layer 31 to add a certain conductivity thereto at a rate equal to or greater than 1020 cm$^{-3}$ by means of either implantation or diffusion using POcl3. Consequently, the poly-crystalline silicon layer 31 becomes an n+poly-silicon layer.

Figure 2A:
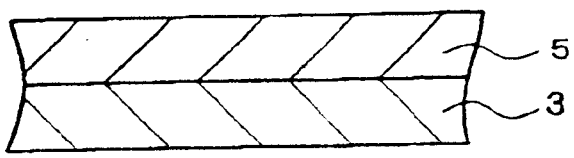
FIG. 2A through FIG. 2D are cross-sectional views illustrating production process of the semiconductor device 1 shown in FIG. 1.
Figure 2B:
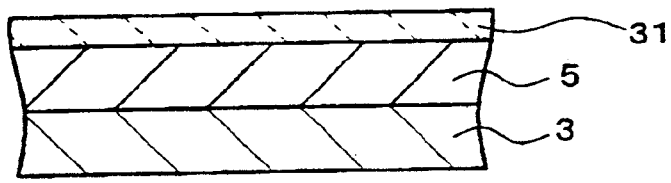
Figure 2C:
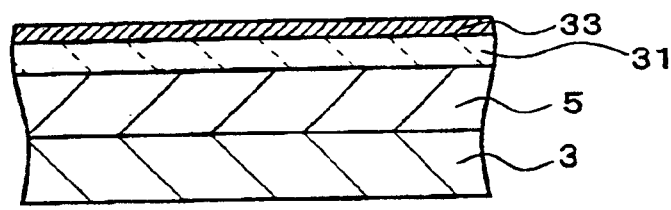

A tungsten silicon compound layer 33 is disposed on the poly-crystalline silicon layer 31 in thickness of 1,500 angstrom (see FIG. 2C). The compound layer 33 is composed of a chemical compound of tungsten and silicon.

Figure 2D:
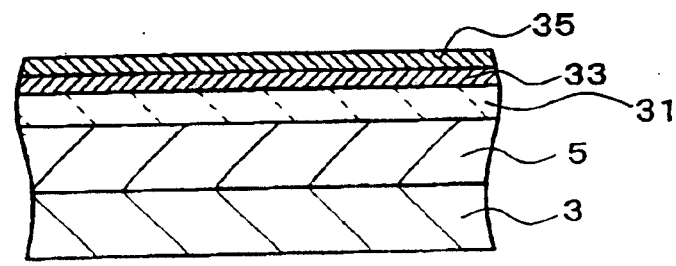

Further, a poly-crystalline silicon layer 35 is formed on the compound layer 33 in thickness of 600 angstrom (see FIG. 2D). Both the poly-crystalline silicon layer 31 and the silicon layer 35 are formed by means of low pressure chemical vapor deposition (LPCVD), and the compound layer 33 is disposed by means of spattering respectively.

Figure 3A:
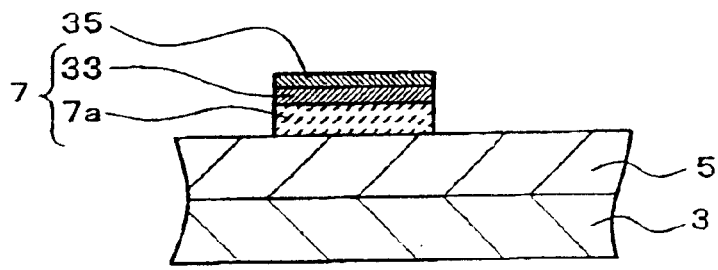
FIG. 3A through FIG. 3D are cross-sectional views illustrating production process of the semiconductor device 1 shown in FIG. 1.
Figure 3B:
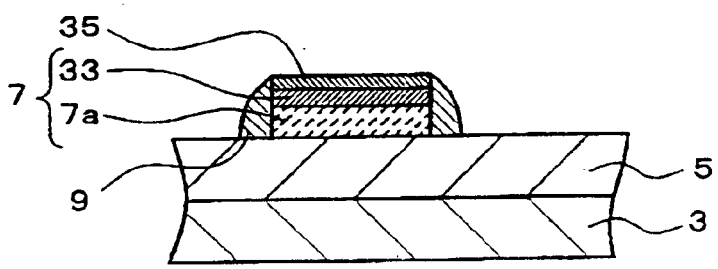
Figure 3C:
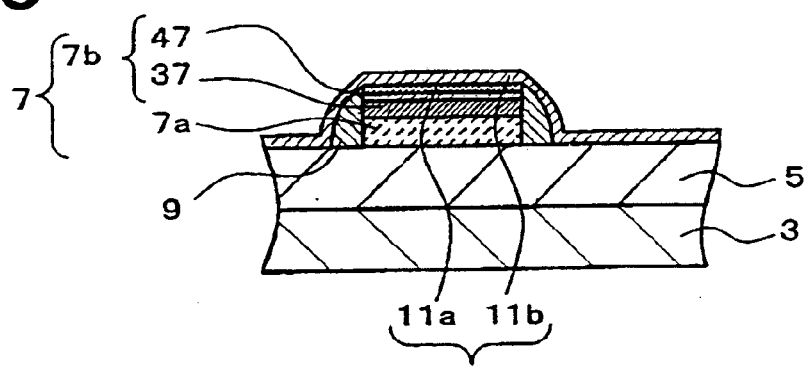

Next, the lower electrode 7 is formed by using photo lithography and photo etching technique (see FIG. 3A). Then, the side walls 9 are disposed on both sides of the electrode 7 (see FIG. 3B). Thereafter, the ONO layer 11 is formed so as to cover the lower electrode 7 (see FIG. 3C).

The lowermost layer and the uppermost layer of the ONO layer 11b, both of which are made of silicon oxide are formed by means of thermal oxidation. A lower tungsten silicide layer 37 is formed as a result of lowering electric resistance of the compound layer 33 by using reaction caused heat applied during the thermal oxidation.

In addition, an upper tungsten silicide layer 47 is formed as a result of reacting tungsten contained in the compound layer 33 and poly-crystalline silicon contained in the silicon layer 35. Further, the tungsten-silicide layer 7b is composed of the lower tungsten silicide layer 37 and the upper tungsten silicide layer 47. In this way, the lower electrode 7 consisting of the silicon lower electrode layer 7a and the tungsten-silicide layer 7b is formed.

Further, an oxidation layer consisting a lower-most part of the ONO layer 11b is formed on the silicon layer 35 as a result of reaction between poly-crystal silicon of the silicon layer 35 and oxygen introduced for the thermal oxidation. The silicon capacitance layer 11a is composed of the silicon layer 35 remained between the lower-most oxidation layer of the ONO layer 11b and the tungsten silicide layer 47.

The reason for forming the silicon layer 35 to 600 angstroms in thickness is to protect the compound layer 33 completely from the thermal oxidation even when both the upper and the lower portions of the silicon layer 35 are respectively eroded during formation of the lower-most oxidation layer of the ONO layer 11b and formation of the silicide. In this embodiment, it is estimated that the thickness of the silicon layer 35 originally having 600 angstroms in thickness decreases to approximately 90 angstroms.

As described above, the capacitance of the semiconductor device 1 is not decreased remarkably in comparison with that of the prior art device not having the silicon capacitance layer 11a (see FIG. 9) because the silicon capacitance layer 11a is formed as a protection part for protecting the compound layer 33 from oxidation.

A nitride layer (silicon nitride layer) of the ONO layer 11b is formed under low pressure CVD method.

Figure 3D:
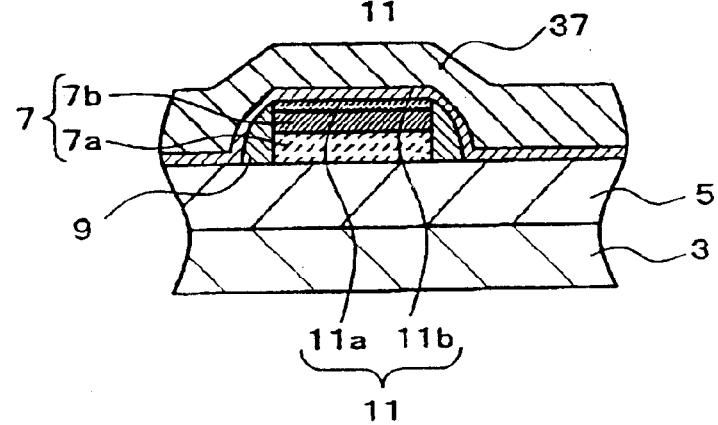

As shown in FIG. 3D, another poly-crystalline silicon layer 37 is formed on the ONO layer 11 in a thickness of 2,000 angstrom. The silicon upper electrode layer 13a is formed by means of photo lithography and photo etching technique using the techniques similar to forming the lower electrode 7 (see FIG. 4A). An oxidation layer 39 made of tetraethoxysilane (hereinafter referred to as TEOS) is disposed on an area(s) where no silicification is carried out prior to silicifying the upper electrode layer 13a in order to protect the unsilicified area(s) (see FIG. 4B).

Figure 4A:
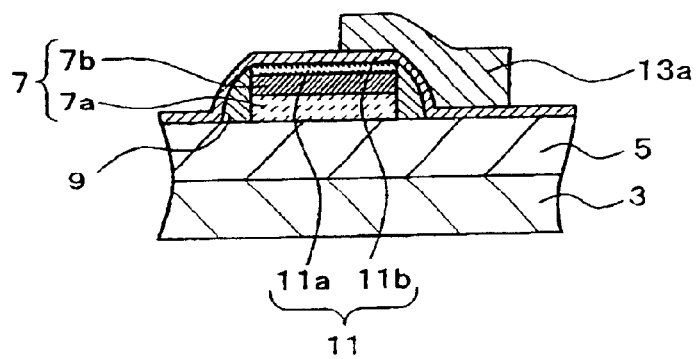
FIG. 4A through FIG. 4D are cross-sectional views illustrating production process of the semiconductor device 1 shown in FIG. 1.
Figure 4B:
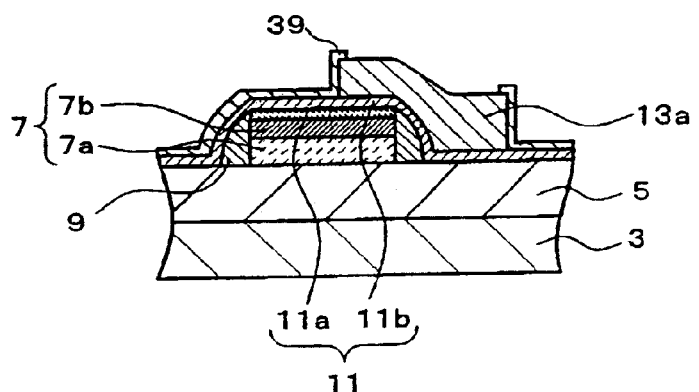
Figure 4C:
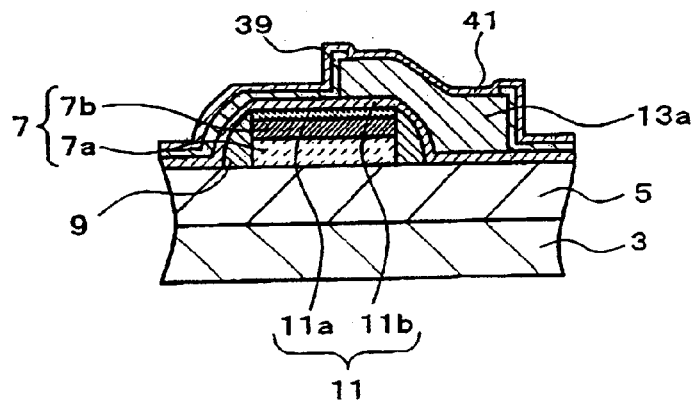
Figure 4D:
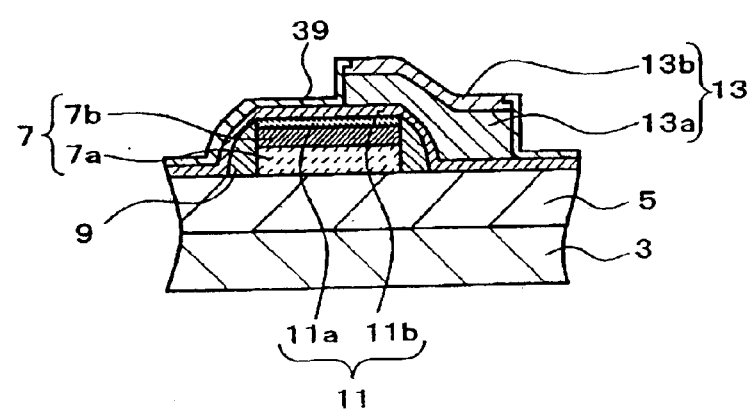

As shown in FIG. 4C, a titanium layer 41 is disposed on the entire surface by means of sputtering. After forming the titanium layer 41, the titanium silicide layer 13b is formed on the upper electrode layer 13a by means of heat treatment. A part of the titanium layer deposited on the TEOS oxidation layer 39 is not silicified because of no direct contact between the titanium and the poly-crystalline silicon. Only the unsilicified titanium layer is removed by selective etching. Thus, the upper electrode 13 is formed as shown in FIG. 4D.

Figure 5A:
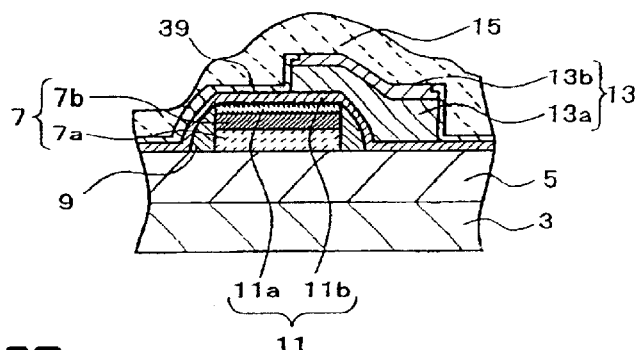
FIG. 5A through FIG. 5D are cross-sectional views illustrating production process of the semiconductor device 1 shown in FIG. 1.
Figure 5B:
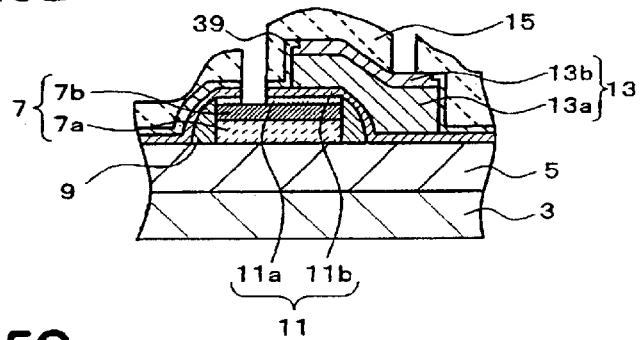

The inter-layer film 15 is disposed by depositing Boro-Phospho-Silicate Glass (BPSG) on the upper electrode 13 and carrying out heat treatment (see FIG. 5A). After disposing the inter-layer film 15, contact holes are formed by means of photo lithography and photo etching technique (see FIG. 5B).

Figure 5C:
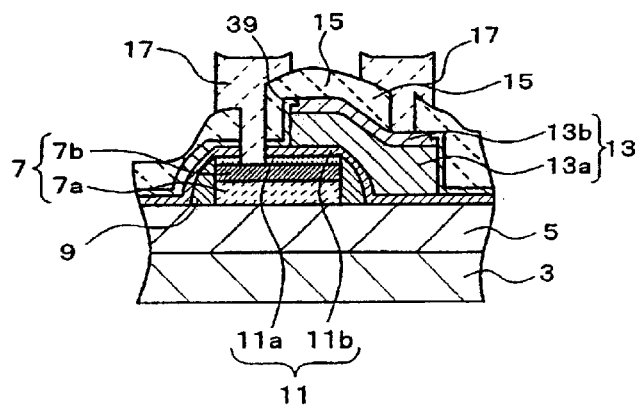

As shown in FIG. 5C, the contact electrodes 17 are formed within and around the periphery of the contact holes by depositing aluminum therein and around the periphery thereof by means of spattering, and carrying out etching and related process (see FIG. 5C).

Figure 5D:
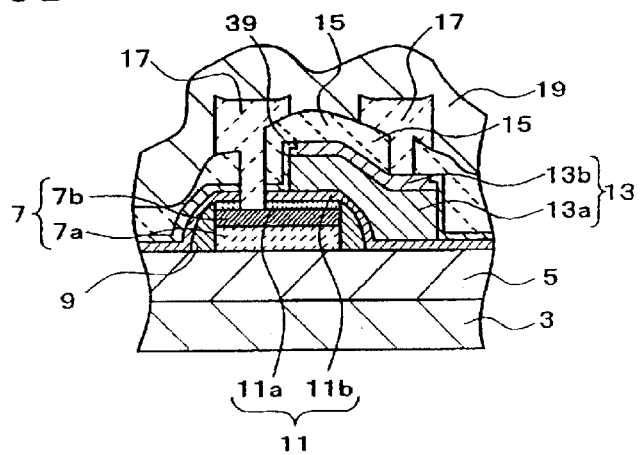

On completing the formation of the contact electrodes 17, the passivation layer 19 for protecting the surface is formed on the entire surface (see FIG. 5D). The semiconductor device 1 is fabricated by carrying out above-mentioned process.

Here, correspondence among the elements in the claims and the elements in this embodiment is defined as the follows. The compound layer 33 and the silicon layer 35 correspond respectively to a part capable of lowering its electric resistance and a protection part.

(3) Electric Characteristics of the Capacitor Type Semiconductor

Figure 6A:
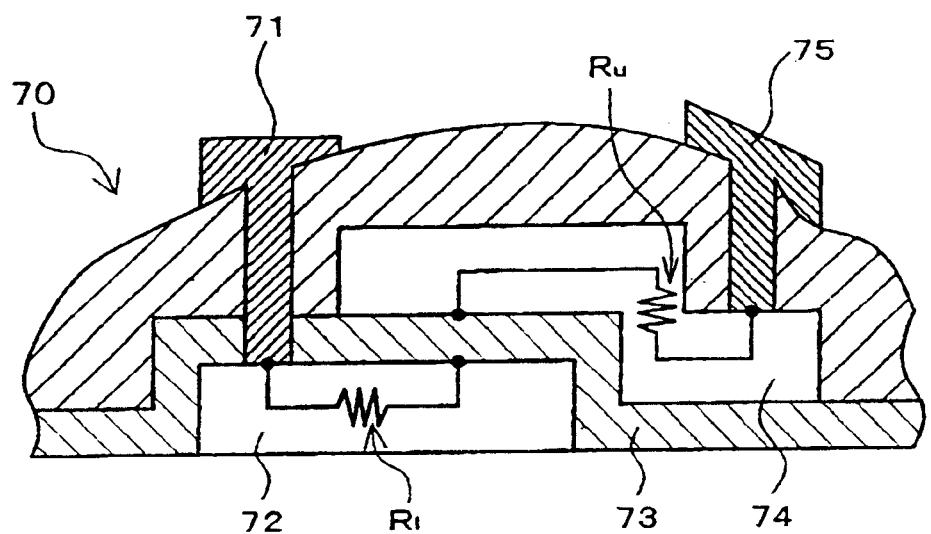
FIG. 6A is a cross-sectional view of an ordinary capacitor type semiconductor device 70 illustrating parasitic resistors formed respectively in an upper electrode and a lower electrode.

Parasitic resistors formed respectively in the upper electrode and the lower electrode of an ordinary capacitor type semiconductor device 70, and an equivalent circuit of the semiconductor device will be described with reference to FIGS. 6A and 6B. FIG. 6A is a cross-sectional view of the semiconductor device 70 illustrating above a semiconductor substrate. The semiconductor device 70 includes contact electrodes 71, 75, a lower electrode 72, an intermediate layer 73 of a capacitor, and an upper electrode 74.

The parasitic resistors R1 and Ru are respectively formed in the lower electrode 72 and the upper electrode 74. This is because materials composing the electrodes have their own electric resistances.

Figure 6B:
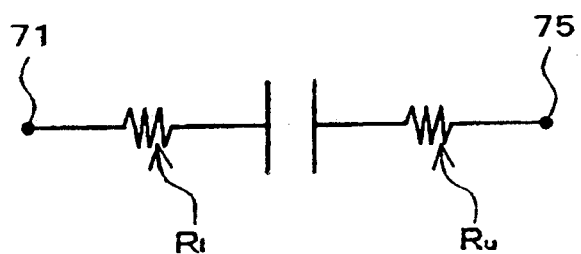
FIG. 6B is a diagram of an equivalent circuit of the semiconductor device 70 including the parasitic resistors formed respectively in the upper electrode and the lower electrode.

FIG. 6B is a diagram of an equivalent circuit of the semiconductor device 70. According to the circuit diagram, it is understood that both the parasitic resistors R1 and Ru could be a factor to determine time constant of the semiconductor device 70.

Figure 7A:
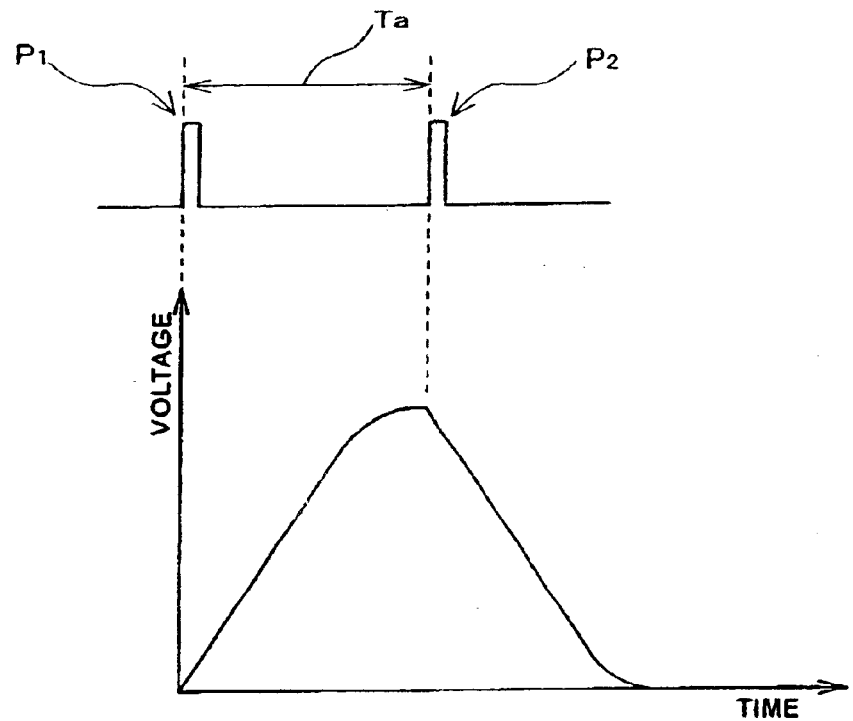
FIG. 7A is a graph for describing a relationship between time constant of the semiconductor device and response characteristic of the semiconductor device to signals externally inputted therein, the graph shows the relationship when the time constant is in a large value.
Figure 7B:
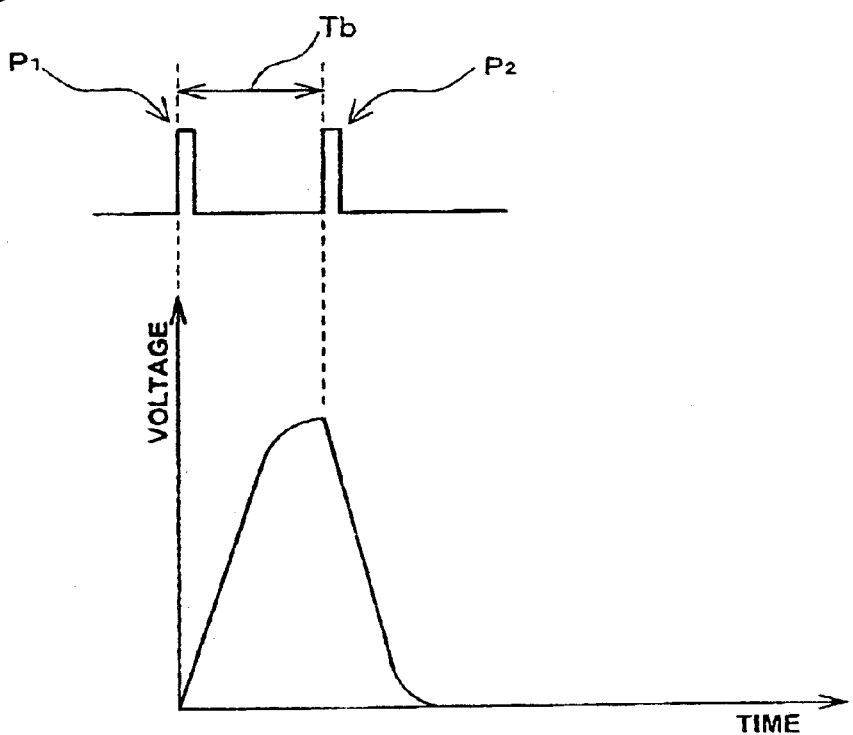
FIG. 7B is a graph for describing a relationship between time constant of the semiconductor device and response characteristic of the semiconductor device to signals externally inputted therein, the graph shows the relationship when the time constant is in a small value.

Consequently, time constant of the semiconductor device 70 becomes smaller in number with decreasing values of the resistors R1 and Ru. In other words, a duration necessary to charge the capacitor (the duration, hereinafter referred to as charging time) provided in the semiconductor device 70 can be shortened as a result of increasing a response speed of the semiconductor device 70. FIGS. 7A and 7B show response characteristic (charging time) of the semiconductor device 70 which varies depending on electric resistance of the parasitic resistors. FIG. 7A shows the charging time when the electric resistance of the parasitic resistors is in a large value, and FIG. 7B shows the charging time when the electric resistance of the parasitic resistors is in a small value.

Both FIGS. 7A and 7B show the cases that an interval between a signal P1 to start charging and a signal P2 to start discharging is minimized, both the signals are externally inputted to the semiconductor device 70. In other words, each of the signals P1, P2 is applied so as to start discharging simultaneously when the charging is completed.

As apparent from the FIGS. 7A and 7B, an interval Tb shown in FIG. 7B in the case of having a smaller electric resistance is shorter than an interval Ta shown in FIG. 7A. In this way, a wide-range response to the signals having a high frequency can be expected by the semiconductor device 70 including electrodes having a low electric resistance.

Figure 8:
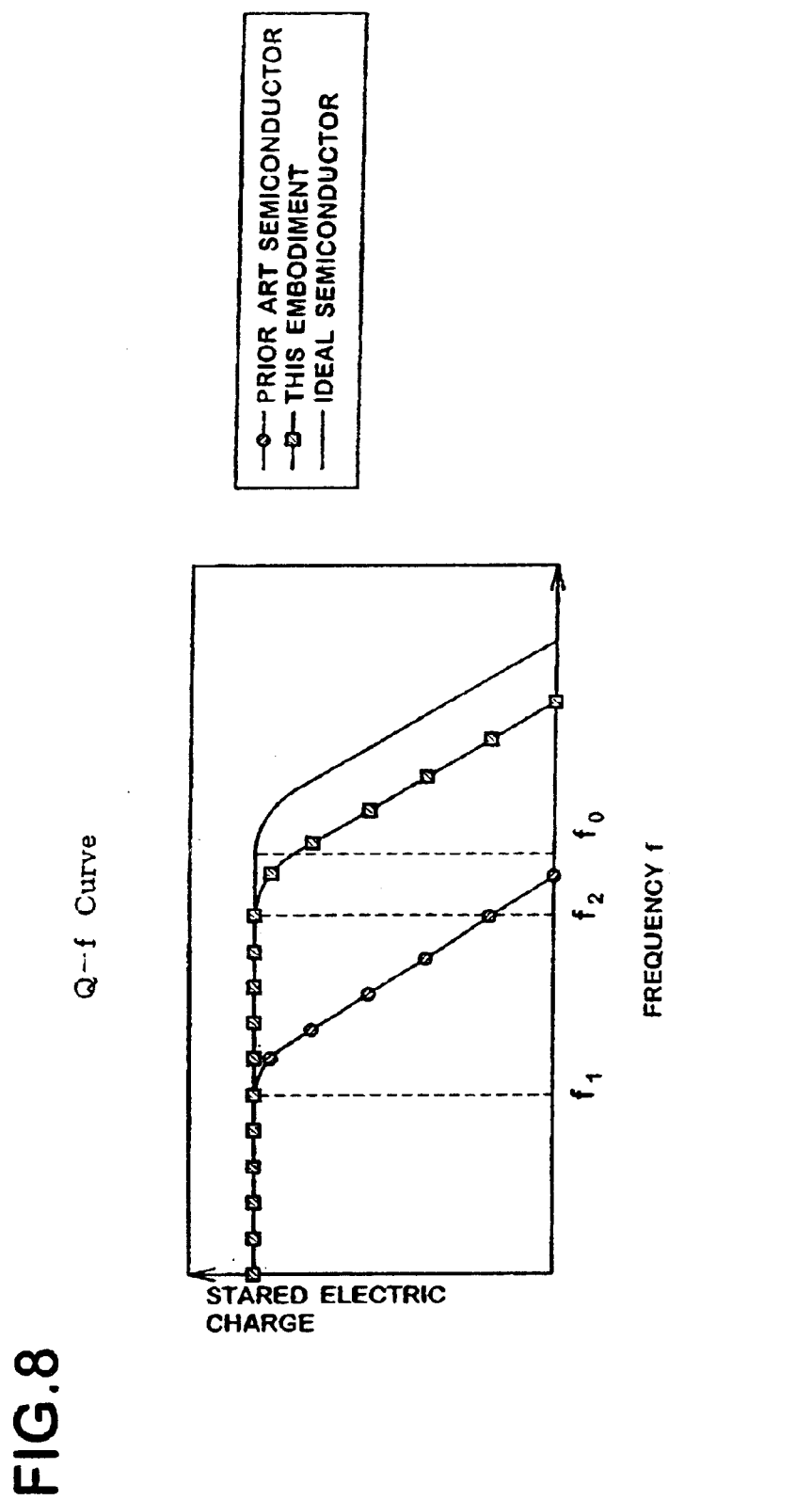
FIG. 8 is a graph for describing response characteristics of the semiconductor device 1 to the signals externally inputted therein.

FIG. 8 is a graph for describing a result of simulation in response characteristics of the semiconductor device 1 and the conventional capacitor type semiconductor device to the signals inputted therein. The abscissa shows frequencies of the signals, and the ordinate indicates electric charges stored in the semiconductor device 1 and the conventional capacitor type semiconductor device.

As apparent from FIG. 8, the semiconductor device 1 according to this embodiment which includes the electrodes having a low electric resistance may respond to signals having higher frequencies than that of the conventional capacitor type semiconductor device. The value of electric resistance of each electrode in the semiconductor device 1 is set so as to be approximately one tenth of that of the conventional semiconductor device. The value is similar to that of each electrode after silicification using titanium.

Figure 11:
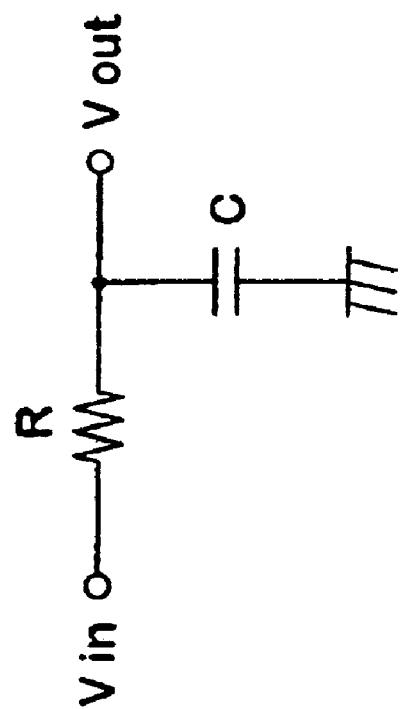
FIG. 11 is a diagram of an equivalent circuit is when it is thought that there is no resistance in upper electrode and lower electrode.

FIG. 11 is a diagram of an equivalent circuit is when it is thought that there is no resistance in upper electrode and lower electrode. The pole frequency fc0 (it considers as ideal pole frequency fc0 hereafter.) in FIG. 11 becomes fc0=1/(2piRC).

Figure 12:
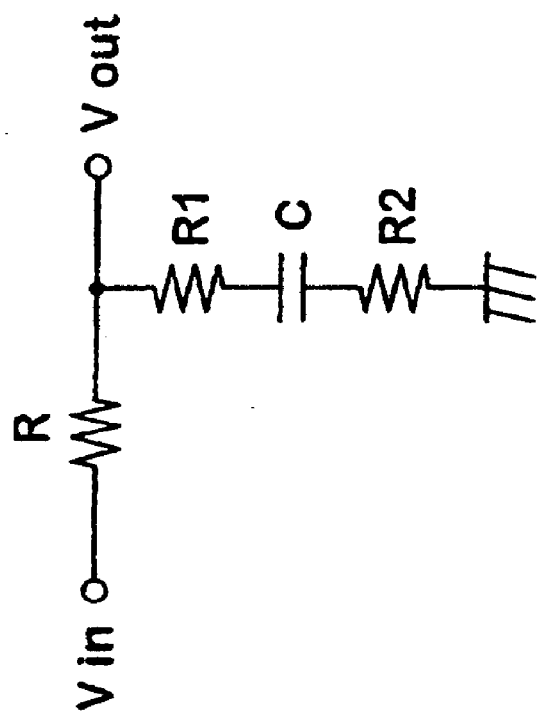
FIG. 12 is a diagram of an equivalent circuit when it is thought that there is resistance in upper electrode and lower electrode.

On the other hand, FIG. 12 is a diagram of an equivalent circuit when it is thought that there is resistance in upper electrode and lower electrode. The pole frequency fc1 in FIG. 12 becomes fc1=1/(2piC(R+R1+R2)). Therefore, the difference Δ fc1 of he ideal pole frequency fc0 and the pole frequency fc1 is Δ fc1=1/(2piCR)*(R1+R2)/(R+R1+R2)).

Furthermore, like this invention, the equivalent circuit at the time of silicified upper electrode and lower electrode is the same as that of FIG. 12. However, the resistance of silicified upper electrode and lower electrode is about 10% of the conventional thing which has not silicified the upper electrode and lower electrode.

Moreover, the capacity of whole capacitor is about 80% as compared with the thing of the former. The pole frequency fc1 in FIG. 12 becomes fc2=1/(2piC(R+0.1(R1+R2))). Therefore, the difference Δ fc2 of the ideal pole frequency fc0 and the pole frequency fc1 is Δ fc2=1/(2pi (0.8)CR)*0.1(R1+R2)/(R+0.1(R1+R2)=1/(2p CR)*1.25*(R1+R2)/(10R+R1+R2). Usually, from R>>R1,R2, it is set to Δ fc2=1/(2piCR)*1.25*(R1+R2)/10(R+R1+R2)=(⅛) (1/(2piCR)*(R1+R2)/(R+R1+R2))=(⅛)fc1.

Thus, the difference of the pole frequency (fc2) of capacitor concerning this invention and ideal pole frequency (fc0) turns into at least 12.5% or less of the difference of the pole frequency (fc1) of conventional capacitor, and ideal pole frequency (fc0).

(4) Other Advantages Achieved by This Embodiment

In general, other kinds of elements such as field effect transistors (FETs) and the like are formed simultaneously with the semiconductor device 1 on other regions of the semiconductor substrate. There might be a case where the gate electrodes, the source and/or the drain regions of the FETs need to be silicified due to a requirement of high-speed operation of LSIs.

According to this embodiment, the gate electrodes, the source and/or the drain regions of the FETs may be silicified simultaneously with silicification of the upper electrode of the semiconductor device 1. In other words, no additional and no special process need to be carried out to silicify the upper electrode of the semiconductor device 1, so that the production process of the conventional semiconductor device may be applied to the semiconductor device according to this embodiment without any modifications.

(5) Other Embodiments

Although, both the lower electrode 7 and the upper electrode 13 are silicified by respectively using tungsten and titanium in the semiconductor device 1 described in the above embodiment, refractory metals used for silicification are not limited to these two metals. Any other refractory metals such as cobalt and nickel can be used for these electrodes.

Though, a chemical compound such as silicide made of silicon and refractory metals is used as an anaerobic material in the semiconductor device 1 described above in the embodiment, any other anaerobic material capable of decreasing electric resistance originally owned by materials of the electrodes can also be used.

Further, poly-crystalline silicon is exampled as an oxygen penetrating restricting material in the semiconductor device 1 described in the above embodiment, any other oxygen penetrating restricting material capable of preventing the anaerobic materials (such as a chemical compound of tungsten and silicon in the above embodiments) from the exposure to oxygen can be used.

Although, both the upper electrode 13 and the lower electrode 7 are silicified (lowering electric resistance) in the semiconductor device 1 described in the above embodiment, the electrode to be silicified may only be the lower electrode 7.

Though, the silicon capacitance layer 11a is formed approximately 90 angstroms in thickness, in the embodiment described previously, the layer may also be formed in another thickness such as in thicker or thinner than 90 angstroms.

Figure 10:
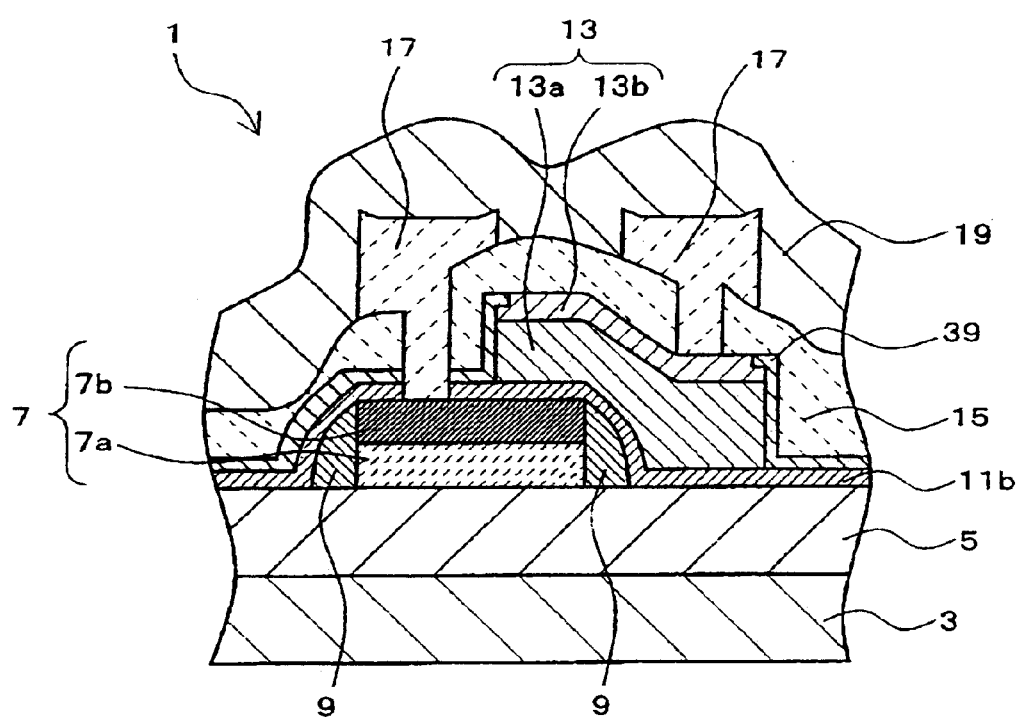
FIG. 10 is a view for describing another embodiment of the semiconductor device according to the present invention, that is, a sectional view of the main features of a capacitance semiconductor device 50.

Alternatively, thickness of the silicon capacitance layer 11 can be controlled as zero as a result of over-growth of the tungsten-silicide layer 7b by changing the manufacturing conditions as shown in FIG. 10. The capacitance of the device will not be undesirably decreased when the thickness of the silicon capacitance layer 11 is controlled as zero.

The device according to the present invention is characterized in that the insulation layer includes a first capacitance portion containing oxygen and a second capacitance portion made of an oxygen penetrating restricting material, and the lower electrode includes a low electric resistance part formed with an anaerobic material. The second capacitance portion is located between the low electric resistance part and the first capacitance portion.

In this way, the low electric resistance part can be formed in a predetermined manner even when the first capacitance portion is formed under a thermal oxidation technique because oxidation of the anaerobic material forming the low electric resistance part is avoided by the second capacitance portion made of the oxygen penetrating restricting material. In other words, electric resistance of the lower electrode can be decreased.

The method of manufacturing a semiconductor device of the present invention is characterized in that the oxygen penetrating restricting material has a high dielectric constant.

In this way, the impact on capacitance of the semiconductor device caused by the second capacitance portion made of the oxygen penetrating restricting material can be decreased.

The semiconductor device of the present invention is characterized in that the first capacitance portion is formed with an ONO (oxide-nitride-oxide) layer. In this way, the second capacitance portion prevents penetration of oxygen into the low electric resistance part. Therefore, electric resistance of the lower electrode can be decreased by forming the low electric resistance part in a predetermined manner.

The semiconductor device of the present invention is characterized in that the oxygen penetrating restricting material is poly-crystalline silicon, and the anaerobic material is of a compound made of a refractory metal and silicon. In this way, the low electric resistance part can be formed in a predetermined manner even when the first capacitance portion is formed, for example, under a thermal oxidation technique because oxidation of the anaerobic material forming the low electric resistance part is avoided by the second capacitance portion made of the poly-crystalline silicon. In other words, electric resistance of the lower electrode can easily be decreased by utilizing poly-crystalline silicon and the compound made of a refractory metal and silicon.

Further, the impact on capacitance of the semiconductor device caused by the second capacitance portion can be decreased by using silicon having a high electric dielectric constant as the oxygen penetrating restricting material.

The semiconductor device of the present invention is characterized in that electric resistance of the upper electrode is lowered. In this way, electric resistance of the upper electrode can also be lowered. Consequently, a total sum of electric resistance of the electrodes can be decreased further.

The semiconductor device of the present invention is characterized in that the insulation layer includes a first capacitance portion containing oxygen, and the lower electrode includes a low electric resistance part formed of an anaerobic material.

In this way, electric resistance of the lower electrode can be decreased.

The method of the present invention is characterized in that it comprises the steps of: forming a part capable of lowering its electric resistance made of an anaerobic material on a semiconductor substrate, disposing a protection part made of an oxygen penetrating restricting material on the lowering part, forming at least a part of a first capacitance portion on the protection part while making a low resistance part by lowering electric resistance of the lowering part, and disposing an upper electrode on the first capacitance portion.

As a consequence, the low electric resistance part can be formed in a predetermined manner even when the first capacitance portion is formed under a thermal oxidation technique because oxidation of the anaerobic material is avoided by the protection layer made of oxygen penetrating restricting material. In other words, electric resistance of the lower electrode can be decreased.

The method of the present invention is characterized in that it comprises the steps of: forming a part capable of lowering its electric resistance made of an anaerobic material on a semiconductor substrate, disposing a protection part made of an oxygen penetrating restricting material on the lowering part, forming at least a part of a first capacitance portion on the lowering part while making a low resistance part by lowering electric resistance of the lowering part, and disposing an upper electrode on the first capacitance portion.

Consequently, the low electric resistance part can be formed in a predetermined manner even when the first capacitance portion is formed under a thermal oxidation technique because oxidation of the anaerobic material is avoided by the protection layer made of oxygen penetrating restricting material. In other words, electric resistance of the lower electrode can be decreased.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A capacitor-type semiconductor device comprising:
    a lower electrode formed on a semiconductor substrate;
    an insulation layer disposed on the lower electrode; and
    an upper electrode formed on the insulation layer,
    wherein the insulation layer includes a first capacitance portion containing oxygen and second capacitance portion made of an oxygen penetrating restricting material, the lower electrode includes a low electric resistance part formed of an anaerobic material, and the second capacitance portion is located between the low electric resistance part and the first capacitance portion.

2. The semiconductor device according to claim 1, wherein the oxygen penetrating restricting material has a high dielectric constant.

3. The semiconductor device according to claim 2, wherein the oxygen penetrating restricting material is silicon, and the anaerobic material is a chemical compound made of a refractory metal and silicon.

4. The semiconductor device according to claim 1, wherein the first capacitance portion is formed of an ONO (oxide-nitride-oxide) layer.

5. The semiconductor device according to claim 3, wherein the oxygen penetrating restricting material is silicon, and the anaerobic material is a chemical compound made of a refractory metal and silicon.

6. The semiconductor device according to claim 5, wherein the refractory metal is tungsten.

7. The semiconductor device according to claim 1, wherein lowering electric resistance of the upper electrode.

8. The semiconductor device according to claim 7, wherein the electric resistance of the upper electrode is lowered by using suicide which is made as a chemical compound of a refractory metal and silicon.

9. A capacitor-type semiconductor device comprising of:
    a first electrode capable of Lowering its resistance made of an anaerobic material on a semiconductor substrate;
    an insulation layer on the first electrode;
    a second electrode capable of lowering its electric resistance made of a refractory metal and silicon on a first capacitance portion,
    wherein the insulation layer includes the first capacitance portion containing oxygen and a second capacitance portion made of an oxygen penetrating redistricting material, the second capacitance portion is located between the first electrode and the first capacitance portion.

10. The semiconductor device according to claim 9, wherein the difference of a pole frequency of a capacitor having the insulation layer and an ideal pole frequency of a capacitor not lowering the resistance of the first electrode and the second electrode turns into at least 12.5% or less of the difference of a pole frequency of a capacitor not having the insulation layer and the ideal pole frequency.

11. The semiconductor device according to claim 9 whereby the capacitor having the insulation layer has a capacitance at least 80% of a capacitor not having the insulation layer.

12. A capacitor-type semiconductor device comprising:
   a lower electrode containing an anaerobic material capable of lowering its resistance on a semiconductor substrate;
   an insulation layer on the lower electrode comprising a first capacitance portion containing oxygen and a second capacitance portion made of an oxygen penetrating restricting material located between the lower electrode and the first capacitance portion; and
   an upper electrode on the first capacitance portion.

13. A capacitor-type semiconductor device comprising:
   a first electrode capable of lowering its resistance made of an anaerobic material on a semiconductor substrate;
   insulation layer on the first electrode comprising a first capacitance portion containing oxygen and a second capacitance portion made of an oxygen penetrating restricting material located the first electrode and the first capacitance portion; and
   a second electrode capable of lowering its electric resistance made of a refractory metal and silicon on the first capacitance portion.

14. The semiconductor device according to claim 13, wherein the difference of a pole frequency of a capacitor having the insulation layer and an ideal pole frequency of a capacitor not lowering to resistance of the first electrode and the second electrode turns into at least 12.5% or less of the difference of a pole frequency of a capacitor not having the insulation layer and the ideal pole frequency.

15. The semiconductor device according to claim 14 wherein the capacitor having the insulation layer has a capacitance of at least 80% of a capacitor not having the insulation layer.

* * * * *